United States Patent
Orlandini

(10) Patent No.: US 6,977,971 B2
(45) Date of Patent: Dec. 20, 2005

(54) DIGITAL DATA TRANSMISSION SYSTEM WITH DEVICE FOR CORRECTING BASELINE WANDER

(75) Inventor: Valter Orlandini, Seriate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 671 days.

(21) Appl. No.: 09/972,776

(22) Filed: Oct. 5, 2001

(65) Prior Publication Data

US 2002/0075963 A1 Jun. 20, 2002

(30) Foreign Application Priority Data

Oct. 6, 2000 (EP) .................................. 00830654

(51) Int. Cl.[7] .......................................... H04L 25/06
(52) U.S. Cl. ..................... 375/317; 375/233; 375/257
(58) Field of Search ............................... 375/317, 233, 375/257

(56) References Cited

U.S. PATENT DOCUMENTS

| | | | |
|---|---|---|---|
| 5,465,272 A | 11/1995 | Smith | |
| 5,812,597 A | 9/1998 | Graham et al. | |
| 5,844,439 A * | 12/1998 | Zortea | 327/307 |
| 5,880,615 A | 3/1999 | Bazes | |
| 6,047,026 A | 4/2000 | Chao et al. | |
| 6,266,366 B1 * | 7/2001 | Greiss et al. | 375/229 |
| 6,415,003 B1 * | 7/2002 | Raghavan | 375/317 |

* cited by examiner

Primary Examiner—Chieh M. Fan
Assistant Examiner—Kevin Kim
(74) Attorney, Agent, or Firm—Lisa K. Jorgenson; Stephen Bongini; Fleit, Kain, Gibbons, Gutman, Bongini & Bianco P.L.

(57) ABSTRACT

There is provided a digital data transmission system that includes a first unit transmitting a first MLT3 signal, a second unit receiving the first MLT3 signal, and transformers. The second unit includes an equalizer receiving the first MLT3 signal and outputting a second MLT3 signal that is input to a recovery module for the transmitted digital data, and a device placed in feedback to the equalizer. The device receives the second MLT3 signal and outputs a third low frequency signal that is added to the first MLT3 signal. The device has a translation block for the up or down or no translation of the second MLT3 signal according to the low or high or intermediate value of such signal, and a low pass filter receiving the signal output from the translation block and outputting the third signal containing the low frequency component of the second MLT3 signal.

18 Claims, 9 Drawing Sheets

DIGITAL DATA TRANSMISSION SYSTEM WITH DEVICE FOR CORRECTING BASELINE WANDER

CROSS-REFERENCE TO RELATED APPLICATIONS

This application is based upon and claims priority from prior European Patent Application No. 00830654.0, filed Oct. 6, 2000, the entire disclosure of which is herein incorporated by reference.

BACKGROUND OF THE INVENTION

1. Field of the Invention

The present invention relates to a digital data transmission system (e.g., at 100 Mb/s) with a device for correcting the baseline wander, and is particularly suited for an ethernet system. The present invention also relates to a receiver of a digital data transmission system (e.g., at 100 Mb/s).

2. Description of Related Art

Typically, an ethernet system comprises several stations which transmit and receive data from at least one central hub by utilizing fibers or twisted wire pairs as transmission means. The several stations transmit digital data through the transmission means and both the stations and the central hub must have suitable transformers for receiving and transmitting data.

In the case where a 100 Mb/s data transmission must be achieved (for example through a category 5 wire twisted pair), a 4-bit or 5-bit encoder can be utilized. The resulting 125 Mb/s binary signal is converted to a three-level transmission signal by utilizing an MLT3 line encoding. Such MLT3 encoding results in a base band signal that consists of three levels: +1, 0, −1. A binary signal is transformed into an MLT3 signal by mapping each digital one into a transition and each digital zero into a no transition. For example, a binary series of five ones cause an output which cycles through three levels in the following order: 0, +1, 0, −1, 0.

The non-ideal transmission channel, which comprises the transformers that couple both the stations and the central hub to the transmission means, may cause the waveform of the received signal to be significantly different from the waveform of the transmitted signal. An undesired effect of the transmission channel on the waveform of the transmitted signal is commonly called "baseline wander". To minimize the tones in the transmitted spectrum, the digital data are scrambled prior to being encoded according to MLT3 encoding. In the worst case, the output of the scrambler may have up to 56 consecutive zeroes.

The scrambled digital signal is MLT3 encoded and it is then coupled for example to a category 5 wire twisted pair through transformers. Since the transformers are high pass filters in nature, the energy below their cutoff frequency of about 50 kHz is lost. If in the signal many periods with few transitions are present, the signal loses significant energy at low frequencies due to the presence of the transformer. In this way, the received waveform can suffer clipping within the receiver and induce errors in the received data even in the case where the lengths of the lines are short. For this reason, the baseline wander effect must be corrected in the receiver.

One recent solution allows recovery of data through data slicers, that is elements able to recover data in the receiver and which allow by means of a digital-analog converter to add the information of the low frequency component to the input of the receiver, as described in the article "A CMOS Transceiver for 10-Mb/s and 100-Mb/s ethernet" (IEEE Journal of Solid-state Circuits, Vol. 33, No. 12, December 1998, pages 2169–2177).

SUMMARY OF THE INVENTION

In view of these drawbacks, it is an object of the present invention to overcome the above-mentioned drawbacks and to provide an improved digital data transmission system with a device for correcting the baseline wander.

According to preferred embodiments of the present invention, there is provided a digital data transmission system comprising at least one unit which transmits a first MLT3 signal which contains the digital data over at least one cable, at least one second unit which receives the first MLT3 signal and recovers the digital data and transformers which uncouple the at least one first and second unit from the cable, the at least one second unit comprising an equalizer which receives in input the first MLT3 signal and produces a second MLT3 signal in output which is in turn in input to a recovery module for the transmitted digital data, characterized in that the at least one second unit comprises a device placed in feedback to the equalizer, the device receiving in input the second MLT3 signal and producing in output a third low frequency signal which can be added to the first MLT3 signal at the input of the equalizer, the device comprising a block designated for the up or down or no translation of the second MLT3 signal according to the respective low or high or intermediate value of such signal and a low pass filter which receives the signal in output from the translation block and produces in output the third signal which contains the low frequency component of the second MLT3 signal.

The present invention also provides a receiver of a digital data transmission system.

The present invention makes it possible to form a digital data transmission system with a device for correcting the baseline wander which makes such correction in an analog way and in a more exact and stronger way for the presence of the analog feedback.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
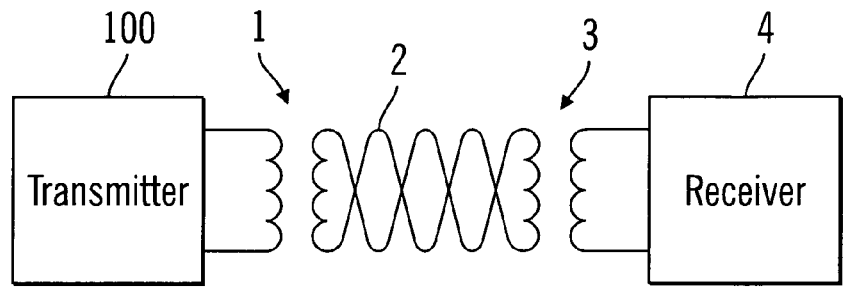
FIG. 1 is a scheme for a digital data transmission ethernet system according to one embodiment of the present invention.

In FIG. 1, a 100 Mb/s digital data transmission ethernet system is schematically shown. The system comprises a unit 100 for transmitting digital data transformed into a MLT3 voltage signal V(TX), that is a voltage signal that consists of three levels: +1, 0, −1 wherein each digital one is mapped into a transition and each digital zero is mapped into a no transition. Such signal V(TX) is sent from the unit 100 by means of a first transformer 1 through a cable 2 with a length of 100 m which is constituted of a category 5 twisted wire pair.

Figure 2:
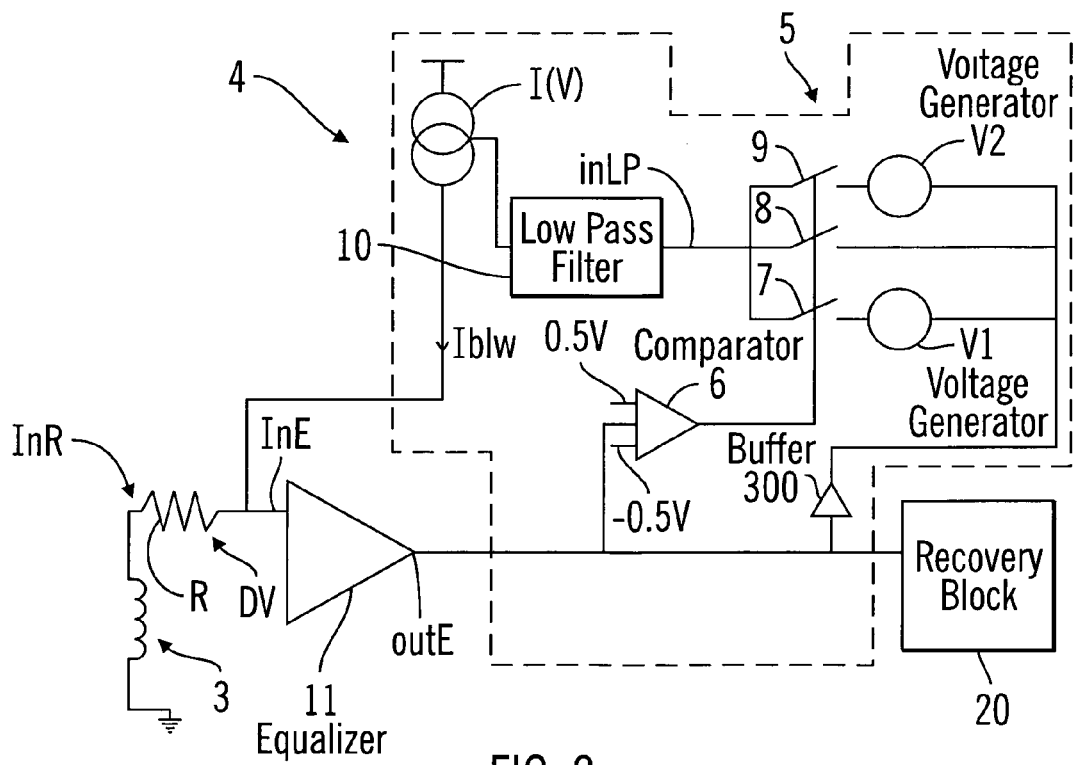
FIG. 2 is a circuit scheme of a receiver of the digital data transmission ethernet system of FIG. 1 with a device for correcting the baseline wander according to a preferred embodiment of the present invention.

By means of a second uncoupling transformer 3 the signal is received by a receiver 4 shown in more detail in FIG. 2. The received signal inR (which is the input current signal of a resistor R) is attenuated, distorted and affected by the phenomenon of the baseline wander (when in the signal many periods with few transitions are present) because the transformers 1 and 3 operate as high pass filters with a cutoff frequency of about 50 kHz.

The signal inR is added to a signal Dv, which is the voltage signal constituted by the current signal Iblw for the resistor R, to achieve the voltage signal inE. The signal Iblw is the feedback signal generated by a device 5 for correcting the baseline wander. Such device comprises a comparator 6, switches 7–9 controlled by the output signal of the comparator 6 and a low pass filter 10. The switches 7 and 9 are connected to two direct voltage generators, respectively V1 at 1V and V2 at −1V. The voltage signal inE is input to an equalizer 11 which produces an output signal outE. Such signal is supplied both to the comparator 6 and to the switches 7–9. According to the voltage value of the signal outE, (that is if such signal is lower than −0.5V, between −0.5V and 0.5V, or higher than 0.5V), the signal outE is translated or is not translated in voltage, and specifically it is translated in voltage of 1V, is not translated or is translated in voltage of −1V.

The signal inLP so-achieved is supplied to the low pass filter 10 having a cutoff frequency of about 50 kHz. The voltage signal output from the filter 10 controls a current generator I(V) which produces the current signal Iblw directly proportional to the voltage output from the filter 10. In this way, the direct component lost in the two transformers 1 and 3 is recovered. The block between the nodes where it is possible to detect the signals inR and outE has a transfer function equal to that of a high pass filter having a zero in the origin and the first pole at about 500 kHz. The output signal outE is also similar to the transmitted signal and it is sent to a transmitted digital data recovery block 20. It is possible to use an uncoupling buffer 300 between the output of the equalizer and the switches.

Figure 3:
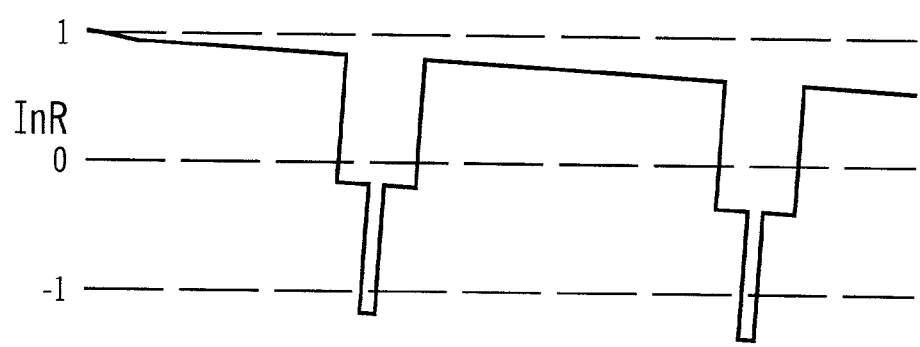
FIG. 3 is a timing diagram of the ideal waveform of the input voltage of the receiver.
Figure 4:
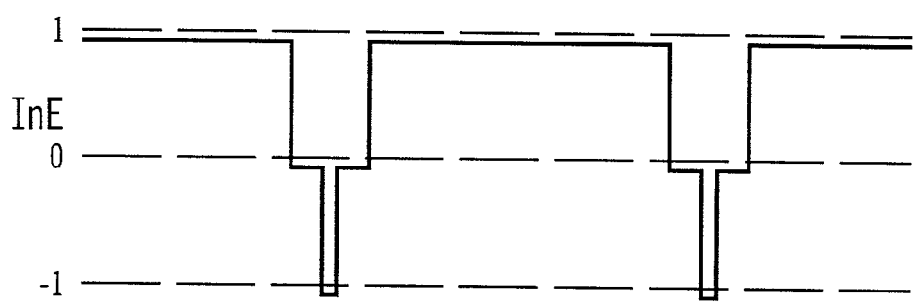
FIG. 4 is a timing diagram of the ideal waveform of the input voltage of the equalizer of FIG. 2.
Figure 5:
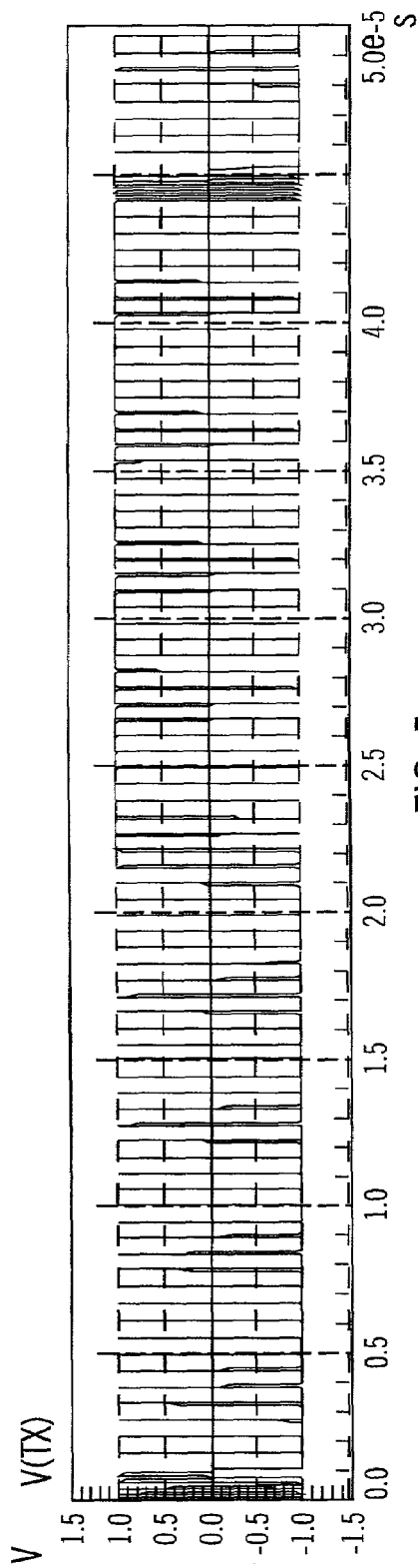
FIGS. 5–9 are timing diagrams of the voltages in several points of the circuit which derive from simulations over an ethernet system of the type of FIG. 1 with a cable of 100 m.
Figure 6:
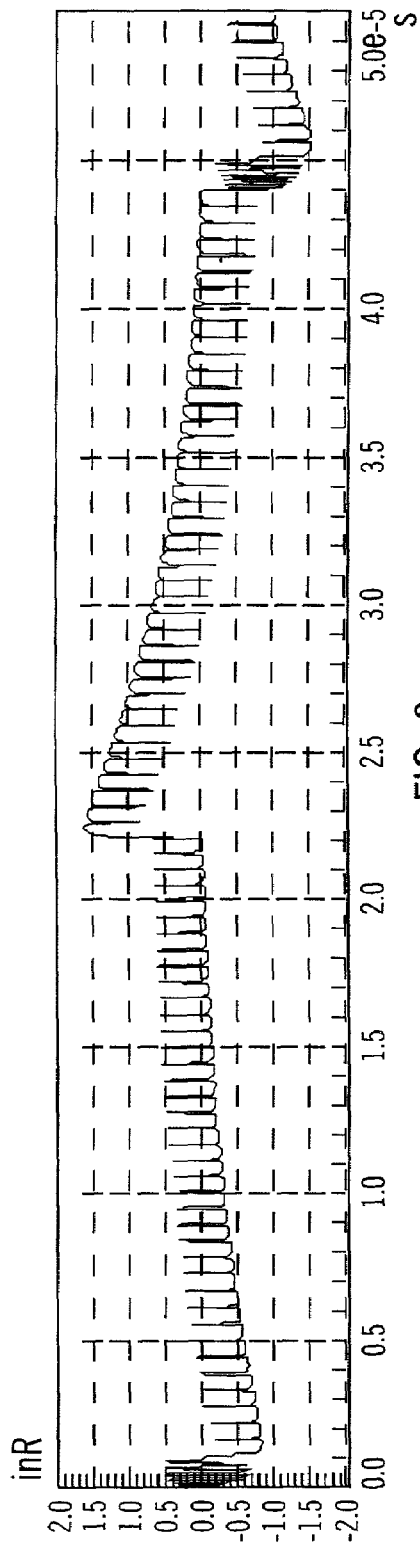
Figure 7:
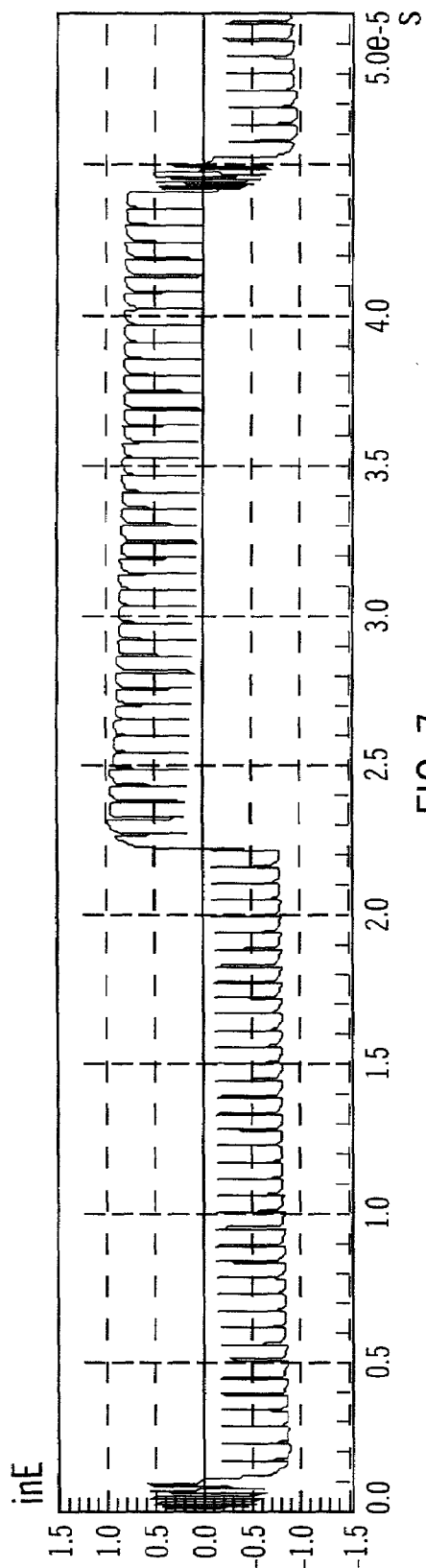
Figure 8:
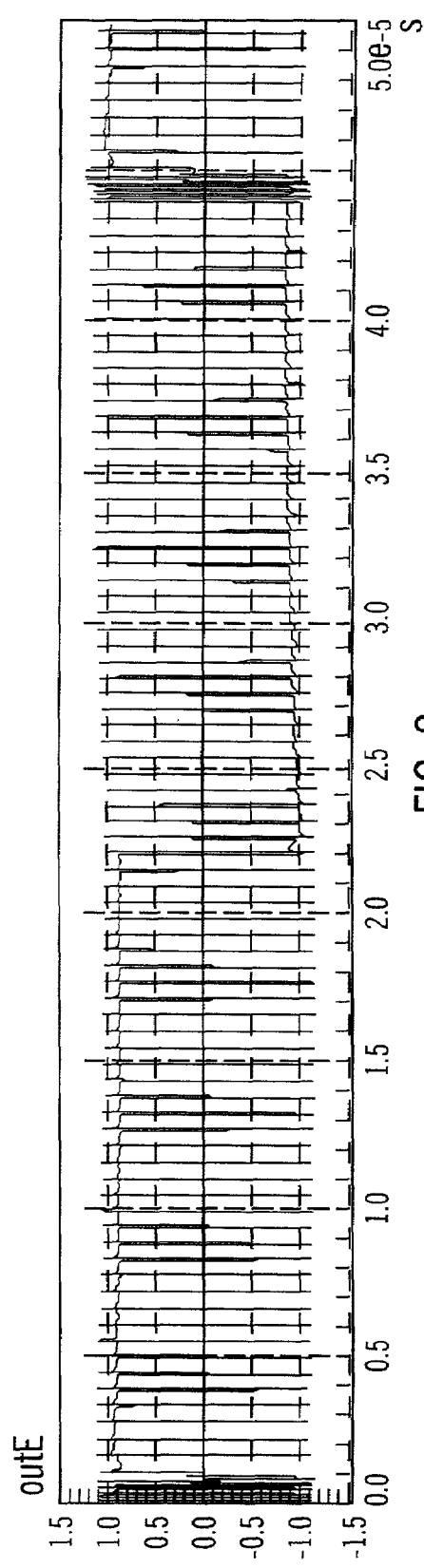
Figure 9:
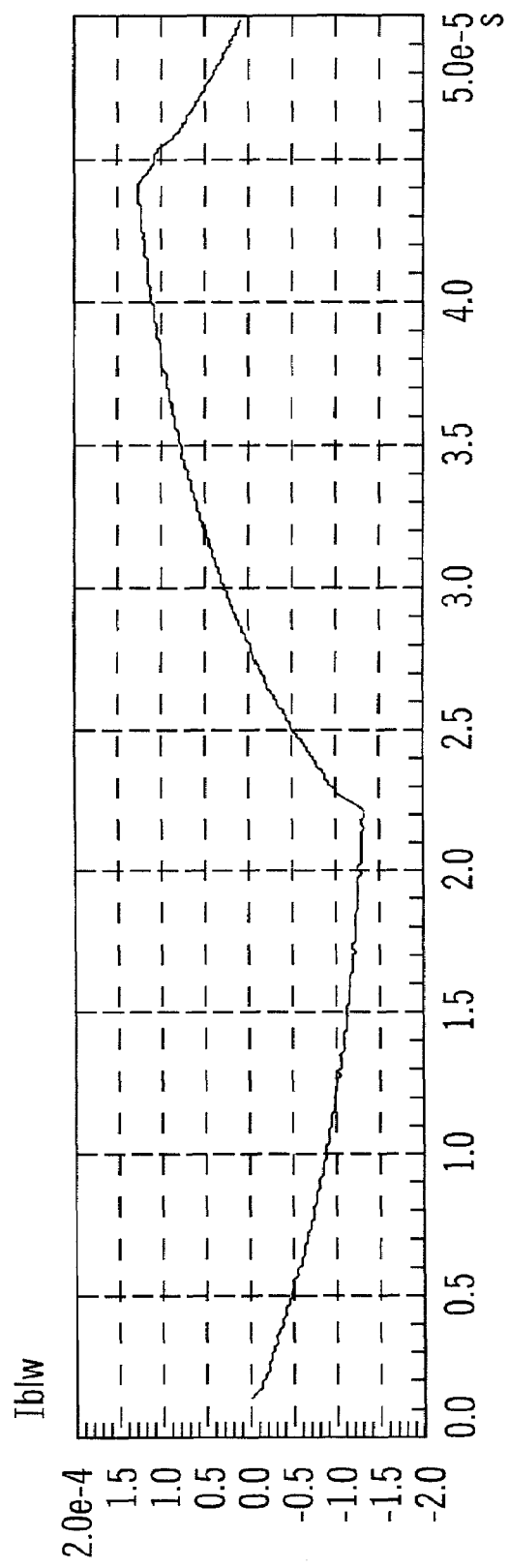

In FIGS. 3 and 4, the ideal waveform of the signals inR and inE in the event where bit sequences with 56 zeroes and 4 ones are transmitted (the ones are indicated by signal transitions and the zeroes by no signal transitions). The effect of the baseline wander, which is not present in the signal inE for the correction operated by the device 5, can be shown in the signal inR.

In FIGS. 5–9, timing diagrams of the voltages at several points of the circuit which derive from simulations over an ethernet system of the type of FIG. 1 with a cable of 100 m are shown. The transmitted voltage signal V(TX) (FIG. 5) of the MLT3 type is attenuated and distorted by the cable 2 and by the transformers 1 and 3, so that it produces a signal inR (FIG. 6) input to the receiver. The current signal Iblw (FIG. 9), which has a time waveform depending on the characteristic of the low pass filter 10, produces the signal Dv over the resistor R which is added to the signal inR for giving the signal inE (FIG. 7) input to the equalizer 11. The signal outE (FIG. 8) output from the equalizer 11 is the equalized signal with the recovered direct component.

Figure 10:
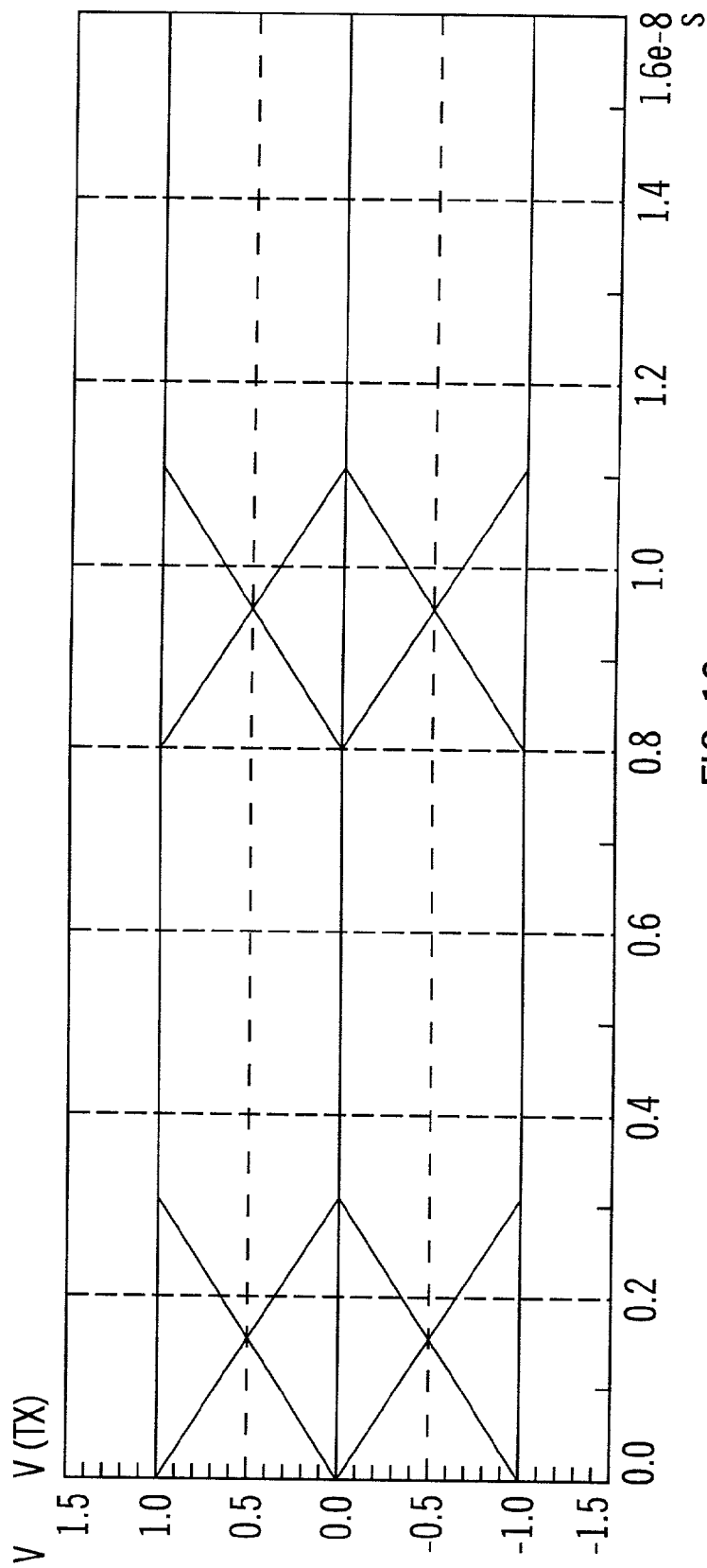
FIGS. 10–12 are eye diagrams of the transmitted, received and corrected voltages derived from simulations over an ethernet system of the type of FIG. 1 with a cable of 100 m.
Figure 11:
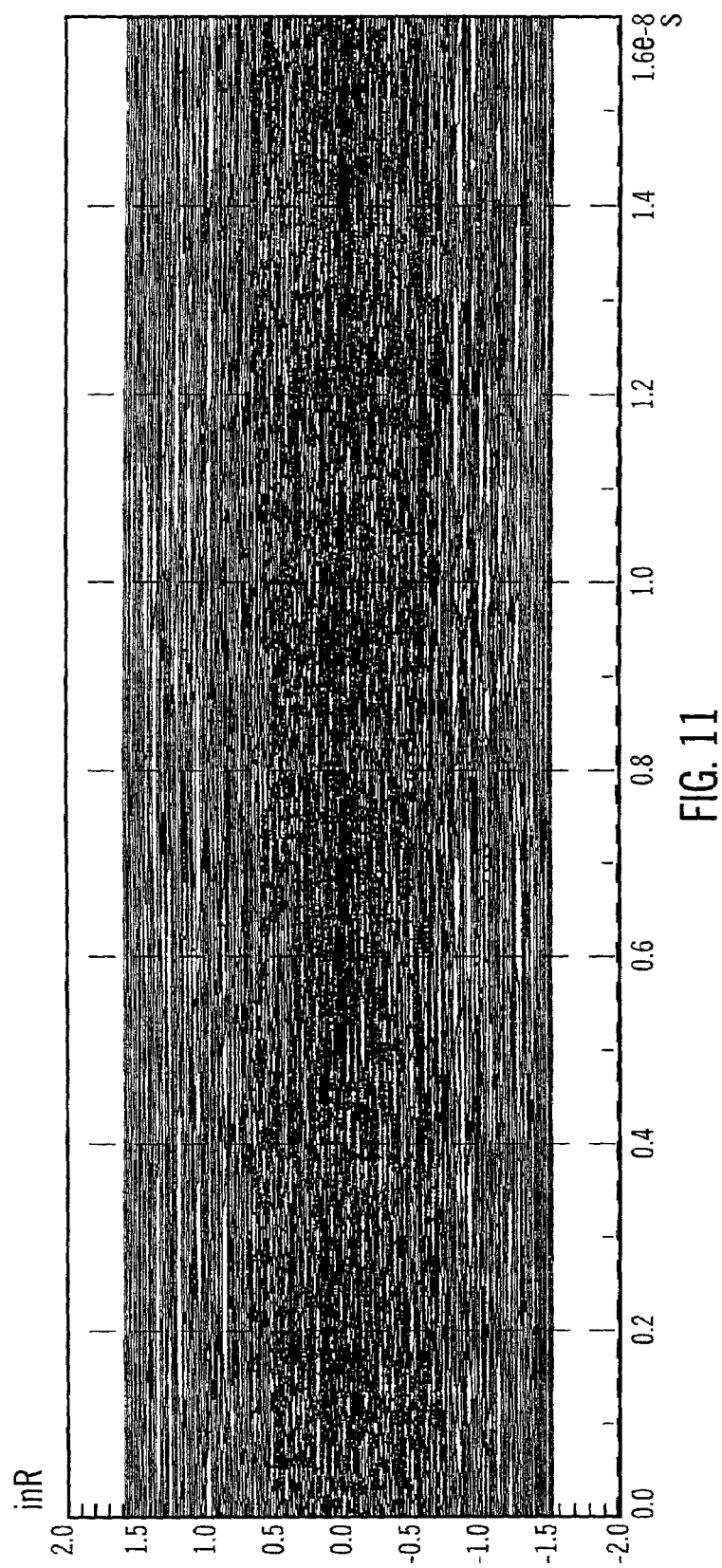
Figure 12:
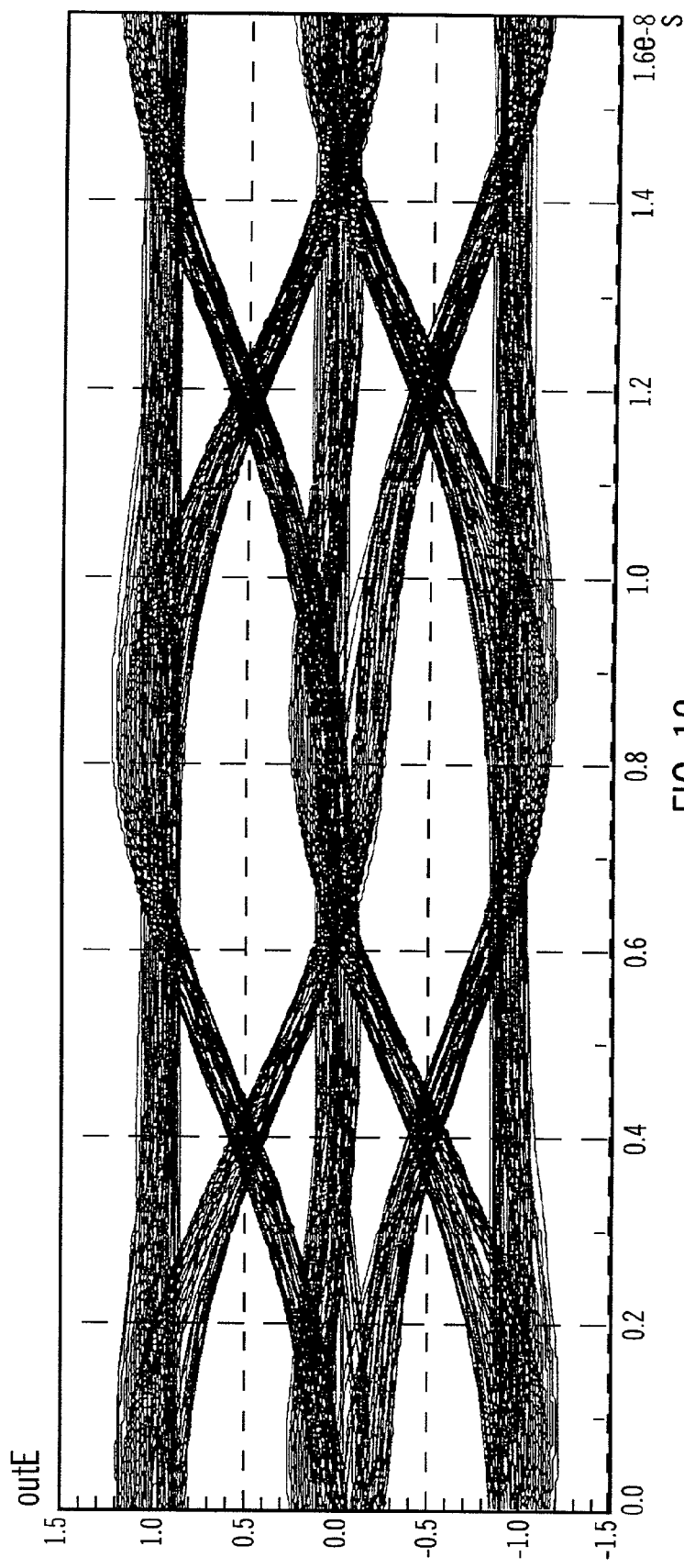

In the FIGS. 10–12, eye diagrams of the signal V(TX) (FIG. 10), the signal inR (FIG. 11) and the signal outE (FIG. 12) are shown, with such signals being obtained from simulations over an ethernet system of the type of FIG. 1 with a cable of 100 m. It is possible to see from the distance among the signal paths in the eye diagram of the signal outE that such signal offers a large action field to the circuits following the device 5 of FIG. 2.

Figure 13:
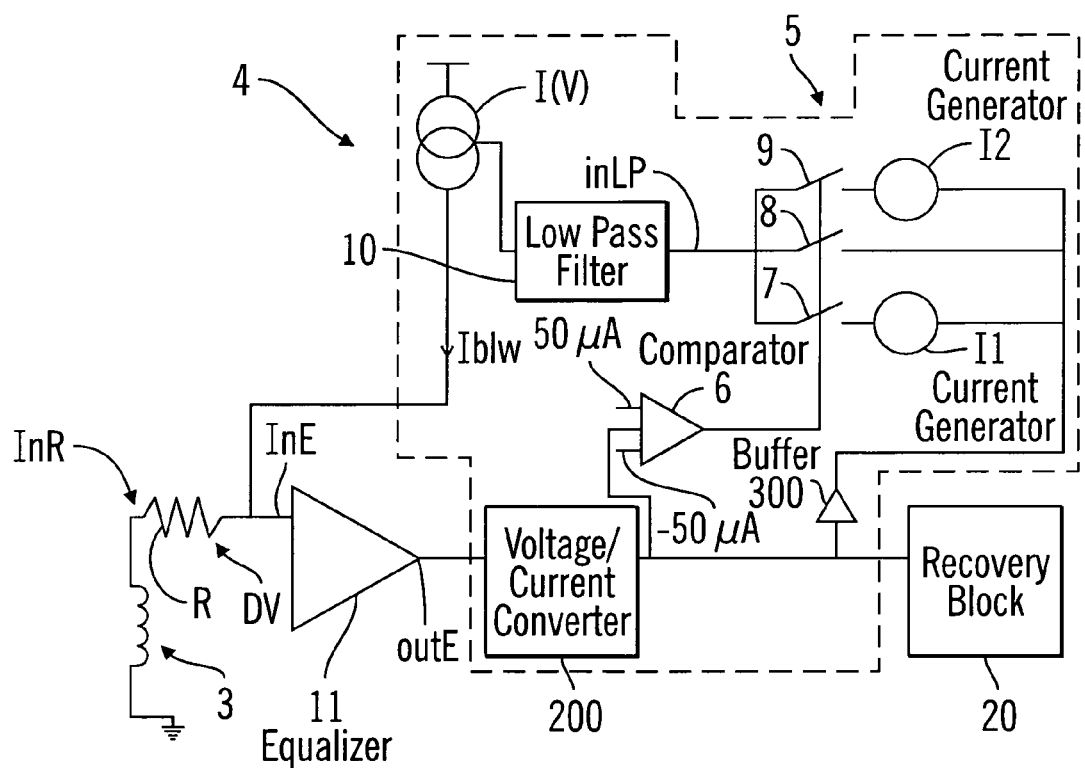
FIG. 13 is a circuit scheme of a receiver of the digital data transmission ethernet system of FIG. 1 with a device for correcting the baseline wander according to another embodiment of the present invention.

In FIG. 13, there is shown a circuit scheme of a receiver of the 100 Mb/s digital data transmission ethernet system of FIG. 1 with a device for correcting the baseline wander according to another embodiment of the present invention. Such circuit scheme differs from the circuit scheme of FIG. 2 in the presence of a voltage/current converter 200 which converts the voltage signal outE output from the equalizer 11 into a current Iout which is supplied both to the comparator 6 and to the switches 7–9 controlled by the comparator 6. Two direct current generators I1 and I2 are respectively connected to the switches 7 and 9, with respective values of 100 µA and −100 µA.

According to the value of the signal Iout, (that is, if such signal is lower than −50 µA, is between −50 µA and 50 µA, or is higher than 50 µA), the signal Iout is translated or is not translated in current, and specifically it is translated in current of 100 µA, is not translated, or is translated in current of −100 µA. The signal InLP so-achieved is sent in input to the low pass filter 10 having a cutoff frequency of about 50 kHz. The voltage signal output from the filter controls the current generator I(V) which produces the current signal Iblw which is directly proportional to the voltage output from the filter 10.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A digital data transmission system including at least one first unit that transmits a first MLT3 (Multi-Level Tone 3) signal containing digital data over at least one cable, at least one second unit that receives the first MLT3 signal and recovers the digital data, and transformers that uncouple the first and second units from the cable, said second unit comprising:

an equalizer that receives the first MLT3 signal at an input, and outputs a second MLT3 signal;

a recovery module for the transmitted digital data that receives the second MLT3 signal; and a device placed in feedback to the equalizer, the device receiving the second MLT3 signal and outputting a third signal that is added to the first MLT3 signal at the input of the equalizer, wherein the device includes a translation block for up or down or no translation of the second MLT3 signal according to the low or high or intermediate value of the second MLT3 signal, and a low pass filter that receives a signal output from the translation block and outputs the third signal that contains a low frequency component of the second MLT3 signal.

2. The system according to claim 1, wherein the second MLT3 signal is a voltage signal, and in the translation block, the second MLT3 signal is translated by approximately −1V or 1V when the value of the second MLT3 signal is higher than approximately 0.5V or lower than approximately −0.5V, while there is no translation of the second MLT3 signal if its value is between approximately −0.5V and 0.5V.

3. The system according to claim 2, wherein the translation block includes:

a comparator that has thresholds of approximately 0.5V and −0.5V and receives at input the second MLT3 signal; and three switches controlled by the comparator, each of the switches being connected to the output of the equalizer and two of the switches being connected to voltage generators of values of approximately −1V and 1V.

4. The system according to claim 1, wherein the second MLT3 signal is a voltage signal, and in the translation block, the second MLT3 signal is converted by a voltage/current converter so as to produce a current signal that is translated by approximately −100 $\mu$A or by 100 $\mu$A when the value of the current signal is higher than approximately 50 $\mu$A or lower than approximately −50 $\mu$A, while there is no translation of the current signal if its value is between approximately −50 $\mu$A and 50 $\mu$A.

5. The system according to claim 4, wherein the translation block includes:

a comparator that has thresholds of approximately 50 $\mu$A and −50 $\mu$A and receives the current signal; and three switches controlled by the comparator, each of the switches being connected to the output of the voltage/current converter and two of the switches being connected to current generators of values of approximately −100 $\mu$A and 100 $\mu$A.

6. The system according to claim 1, wherein the signal output from the low pass filter is a voltage signal that controls a current generator that provides a current signal that produces the third signal at the terminals of a resistor, which is disposed between the input of the equalizer and the transformer of the receiver.

7. The system according to claim 3, further comprising an uncoupling buffer located before the switches.

8. The system according to claim 1, wherein the digital data transmission system is an ethernet system.

9. The system according to claim 1, wherein the digital data transmission system is a 100 Mb/s digital data transmission system.

10. A receiver for a digital data transmission system, said receiver comprising:

an equalizer that receives a first MLT3 (Multi-Level Tone 3) signal at an input, and outputs a second MLT3 signal;

a recovery module for transmitted digital data contained in the second MLT3 signal, the recovery module receiving the second MLT3 signal; and a device placed in feedback to the equalizer, the device receiving the second MLT3 signal and outputting a third signal that is added to the first MLT3 signal at the input of the equalizer, wherein the device includes a translation block for up or down or no translation of the second MLT3 signal according to the low or high or intermediate value of the second MLT3 signal, and a low pass filter that receives a signal output from the translation block and outputs the third signal that contains a low frequency component of the second MLT3 signal.

11. The receiver according to claim 10, wherein the second MLT3 signal is a voltage signal, and in the translation block, the second MLT3 signal is translated by approximately −1V or 1V when the value of the second MLT3 signal is higher than approximately 0.5V or lower than approximately −0.5V, while there is no translation of the second MLT3 signal if its value is between approximately −0.5V and 0.5V.

12. The receiver according to claim 11, wherein the translation block includes:

a comparator that has thresholds of approximately 0.5V and −0.5V and receives at input the second MLT3 signal; and three switches controlled by the comparator, each of the switches being connected to the output of the equalizer and two of the switches being connected to voltage generators of values of approximately −1V and 1V.

13. The receiver according to claim 10, wherein the second MLT3 signal is a voltage signal, and in the translation block, the second MLT3 signal is converted by a voltage/current converter so as to produce a current signal that is translated by approximately −100 $\mu$A or by 100 $\mu$A when the value of the current signal is higher than approximately 50 $\mu$A or lower than approximately −50 $\mu$A, while there is no translation of the current signal if its value is between approximately −50 $\mu$A and 50 $\mu$A.

14. The receiver according to claim 13, wherein the translation block includes:

a comparator that has thresholds of approximately 50 $\mu$A and −50 $\mu$A and receives the current signal; and three switches controlled by the comparator, each of the switches being connected to the output of the voltage/current converter and two of the switches being connected to current generators of values of approximately −100 $\mu$A and 100 $\mu$A.

15. The receiver according to claim 10, wherein the signal output from the low pass filter is a voltage signal that controls a current generator that provides a current signal that produces the third signal at the terminals of a resistor, which is disposed between the input of the equalizer and a transformer of the receiver.

16. The receiver according to claim 12, further comprising an uncoupling buffer located before the switches.

17. The receiver according to claim 10, wherein the digital data transmission system is an ethernet system.

18. The receiver according to claim 10, wherein the digital data transmission system is a 100 Mb/s digital data transmission system.

* * * * *